United States Patent [19]
Koilpillai et al.

[11] Patent Number: 5,757,300
[45] Date of Patent: May 26, 1998

[54] FEED-FORWARD BANDPASS DELTA-SIGMA CONVERTER WITH TUNABLE CENTER FREQUENCY

[75] Inventors: Ravinder David Koilpillai, Cary, N.C.; David Byrd Ribner, Andover, Mass.; Jerome Johnson Tiemann, Schenectady, N.Y.

[73] Assignee: General Electric Company, Schenectady, N.Y.

[21] Appl. No.: 734,906

[22] Filed: Oct. 22, 1996

[51] Int. Cl.$^6$ .................................................. H03M 3/00
[52] U.S. Cl. .................................................. 341/143; 341/155
[58] Field of Search ................................ 341/143, 155

[56] References Cited

U.S. PATENT DOCUMENTS

| | | | |
|---|---|---|---|
| 5,065,157 | 11/1991 | Ribner et al. | 341/143 |
| 5,103,229 | 4/1992 | Ribner | 341/143 |
| 5,142,286 | 8/1992 | Ribner et al. | 341/143 |
| 5,148,166 | 9/1992 | Ribner | 341/143 |
| 5,181,032 | 1/1993 | Ribner | 341/143 |
| 5,187,482 | 2/1993 | Tiemann et al. | 341/143 |
| 5,283,578 | 2/1994 | Ribner et al. | 341/143 |
| 5,323,157 | 6/1994 | Ledzius et al. | 341/143 |
| 5,392,042 | 2/1995 | Pellon | 341/143 |
| 5,500,645 | 3/1996 | Ribner et al. | 341/143 |
| 5,623,263 | 4/1997 | Kuo et al. | 341/143 |

*Primary Examiner*—Jeffrey A. Gaffin
*Assistant Examiner*—Peguy JeanPierre
*Attorney, Agent, or Firm*—Marvin Snyder

[57] ABSTRACT

Delta sigma modulators for accepting input signals having amplitudes up to −1 dB of full-scale and a center frequency ($F_s$) in the range [$F_s/90$, 44$F_s/90$], and which are not prone to internal overflow, require few circuit parameters, and yield a signal transfer function with the inherent property that the modulator magnitude response is close to unity gain in the frequency region of interest include, in one embodiment, a pair of cascaded integrators, a unit delay element coupled to the output of the second integrator, an analog-to-digital (A/D) converter, and a one-bit digital-to-analog (D/A) converter controlled by output signals from the A/D converter. A first differential summing junction coupled to the output of the D/A converter is responsive to delta sigma modulator input signals. A second differential summing junction, coupled to the output of the first differential summing junction, is also coupled to receive a feedback signal from the second integrator. A third differential summing junction, coupled to the output of the unit delay element, also receives feed-forward signals from the second integrator.

4 Claims, 3 Drawing Sheets

FEED-FORWARD BANDPASS DELTA-SIGMA CONVERTER WITH TUNABLE CENTER FREQUENCY

The U.S. Government has a paid-up license in this invention and the right in limited circumstances to require the patent owner to license others on reasonable terms as provided for by the terms of Contract No. N66001-93C-0077 awarded by the U.S. Navy.

FIELD OF THE INVENTION

The present invention generally relates to oversampled or delta sigma ($\Delta$-$\epsilon$) analog-to-digital (A/D) converters and, more specifically, to feed-forward bandpass delta sigma A/D converters.

BACKGROUND OF THE INVENTION

High resolution analog-to-digital (A/D) signal conversion can be achieved with lower resolution components through the use of oversampled interpolative (or delta sigma) modulation followed by digital low pass filtering and decimation. Oversampling refers to operation of the modulator at a rate many times greater than the Nyquist rate. Decimation refers to reduction of the clock rate by periodic deletion of samples.

Delta sigma modulators (sometimes referred to as sigma delta modulators) have been used in A/D converters for some time. In general, a delta sigma A/D converter uses an internal A/D converter of modest resolution and a complementary digital-to-analog (D/A) converter in a feedback loop. The feedback loop increases the accuracy of the A/D converter in a manner consistent with the high speed operation afforded by the internal A/D converter.

Known delta sigma A/D converters force the noise transfer function (NTF) zeros to be in the proximity of $\omega=0$. Therefore, quantization noise is minimized in a frequency region around d.c. Delta sigma modulators such converters include multiple feedback loops or multiple feed-forward connections with a single feedback loop. For example, one well known modulator is a high-order, single-stage one-bit delta sigma modulator which is insensitive to variations in the quantizer noise threshold and circuit non-linearities. For known high-order delta sigma modulators, the NTF is chosen to be an infinite impulse response (IIR) function, rather than a finite impulse response (FIR) function, in order to control the signal gain at all frequencies.

For delta sigma A/D conversion of bandpass (BP) signals, the NTF of the delta sigma modulator is zero at $\omega=\omega_0$, where $\omega_0$ is the center frequency of the input bandpass signal. Selecting the NTF to have such a characteristic, however, limits range of input amplitudes that can be handled without overflow oscillations. Specifically, the allowable input dynamic range decreases as $\omega_0$, the center frequency, is moved away from $F_S/4$, where $F_S$ is the sampling frequency.

Delta sigma A/D converters for narrowband bandpass signals also are well known. However, the limitation with such known delta sigma A/D converters is that as the bandpass center frequency is moved further from $F_S/4$ (e.g. to $F_S/16$ or $F_S/32$), only a limited range of input amplitudes is permissible in order to avoid overflow oscillations. Such limitations on input amplitudes are, of course, undesirable.

In an alternative delta sigma converter, the NTF is selected to be an FIR transfer function and the signal transfer function (STF) is a pure delay. This converter requires only six parameters to select $\omega_0$ and $F_S$. The drawback this approach is its susceptibility to overflow oscillations outside a narrow frequency region around $F_S/4$.

It would be desirable to provide a modulator that can accept input signals having amplitudes up to $-1$ dB of full-scale and having a center frequency ($F_S$) in the range [$F_S/90$, $90F_S/44$]. It also would be desirable to provide such a modulator that is not prone to internal overflow, requires fewer circuit parameters to adjust $\omega_0$, and $F_S$, and has an STF with the inherent property that the modulator magnitude responses are close to unity gain in the frequency region of interest.

SUMMARY OF THE INVENTION

A feed-forward bandpass (FF-BP) delta-sigma modulator, in one embodiment, includes a pair of cascaded integrators, a unit delay element coupled to the output of the second integrator, an analog-to-digital (A/D) converter in the form of a comparator or threshold circuit, and a one-bit digital-to-analog (D/A) converter controlled by output signals of the A/D converter. A first differential summing junction is coupled to the output of the D/A converter. A second differential summing junction, coupled to the output of the first differential summing junction, also is coupled to receive a feedback signal from the second integrator. A third differential summing junction, coupled to the output of the unit delay element, also is coupled to receive a feed-forward signal from the second integrator. The output signal y(n) of the modulator typically is supplied to a digital filter, the output of which is, in turn, coupled to a decimator.

The modulator described above can accept input signals having amplitudes up to $-1$ dB of full-scale and a center frequency in the range [$F_S/90$, $90F_S/44$] where $F_S$ is the sampling frequency. In addition, the modulator is not prone to internal overflow. An additional advantage is that the modulator requires fewer circuit parameters to adjust its frequency characteristics, e.g., $\omega_0$ and $F_S$. Further, the modulator yields an STF with the inherent property that the modulator magnitude response is close to unity gain in the frequency region of interest.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) in which:

DETAILED DESCRIPTION OF THE PREFERRED EMBODIMENTS

Figure 1:
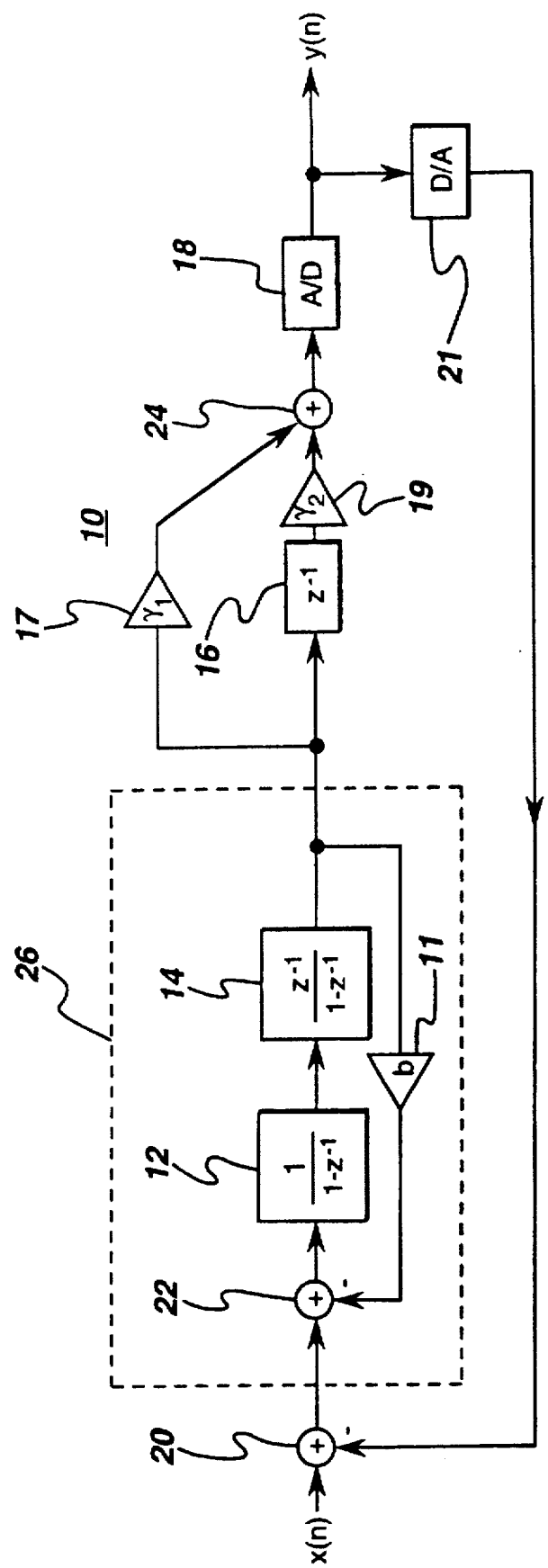
FIG. 1 is a block diagram of a second-order FF-BP delta-sigma modulator in accordance with one embodiment of the present invention.

FIG. 1 illustrates, in block diagram form, a second-order feed-forward bandpass delta sigma modulator 10 in accordance with one embodiment of the invention. Modulator 10 includes a pair of cascaded integrators 12 and 14, a unit delay element 16 and a multiplier 17 of scale factor $\gamma_1$ coupled to the output of integrator 14, a multiplier 19 of scale factor $\gamma_2$ coupled to an analog-to-digital (A/D) converter 18 in the form of a comparator or threshold circuit, and a one-bit digital-to-analog (D/A) converter 21 controlled by the output of A/D converter 18.

A first differential summing junction 20 is coupled to the output of D/A converter 21 and receives input signal x(n). A second differential summing junction 22, coupled to the output of first differential summing junction 20, also receives a feedback signal from second integrator 14 through a multiplier 11 whose value is determined by the center frequency $\omega_0$ of the bandpass input signal. A third differential summing junction 24, coupled between the output of unit delay element 16 and this input to A/D converter 18, is also coupled to receive a feed-forward signal from second integrator 14. The output signal y(n) of A/D converter 18 is typically provided to a digital filter (not shown), the output of which is, in turn, coupled to a decimator (not shown).

Figure 2:
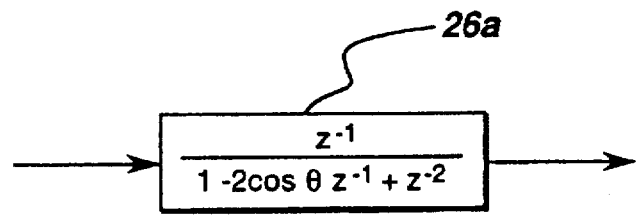
FIG. 2 is a block diagram of an equivalent circuit for the cascaded integrators illustrated in FIG. 1.
Figure 3:
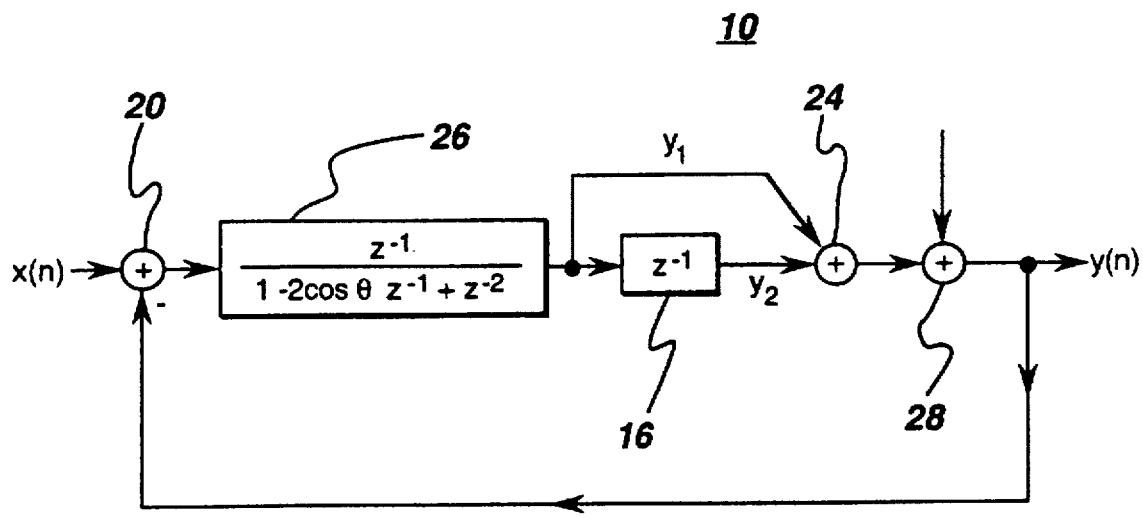
FIG. 3 is a block diagram of a linear equivalent circuit for the circuit illustrated in FIG. 1.

For analysis purposes, cascaded integrators 12 and 14, illustrated in dashed block 26 and producing an output signal, can be represented using the equivalence relation 26a shown in FIG. 2. The linear equivalent circuit for modulator 10, where the quantization noise is represented as an additive noise source e(n) added at a summing junction 28, is shown in FIG. 3. The overall transfer function for the linear circuit shown in FIG. 3, with multiplication by multiplier 11 of b=2(1 - cos $\omega_o$), is:

$$Y(z)=S(z)\,X(z)+N(z)\,E(z) \quad (1)$$

where:

$$STF\ S(z) = \frac{S_{Nr}(z)}{S_{Dr}(z)} = \frac{\gamma_1 z^{-1} + \gamma_2 z^{-2}}{1 + (\gamma_1 - 2\cos\omega_0)z^{-1} + (\gamma_2 + 1)z^{-2}} \quad (2)$$

$$NTF\ N(z) = \frac{N_{Nr}(z)}{N_{Dr}(z)} = \frac{1 - 2\cos\omega_0 z^{-1} + z^{-2}}{1 + (\gamma_1 - 2\cos\omega_0)z^{-1} + (\gamma_2 + 1)z^{-2}} \quad (3)$$

The desired second-order noise transfer function can be represented as:

$$NTF_{desired} = \frac{N_d(z)}{D_d(z)} = \frac{n_0 + n_1 z^{-1} + n_2 z^{-2}}{1 + d_1 z^{-1} + d_2 z^{-2}}, \quad (4)$$

where $n_0=1$, $n_1=2\cos W_0$, $n_2=1$, in order that a notch can be forced at the frequency $\omega_0$ (on the unit circle). The positioning of the poles is determined by $D_d(z)$.

From equations (2) and (3), and given the center frequency $\omega_0$ and the $NTF_{desired}$, then:

$$b=2(1-\cos\omega_0),\ \gamma_1=(d_1+2\cos\omega_0),\ \gamma_2=(d_2-1) \quad (5)$$

Figure 4:
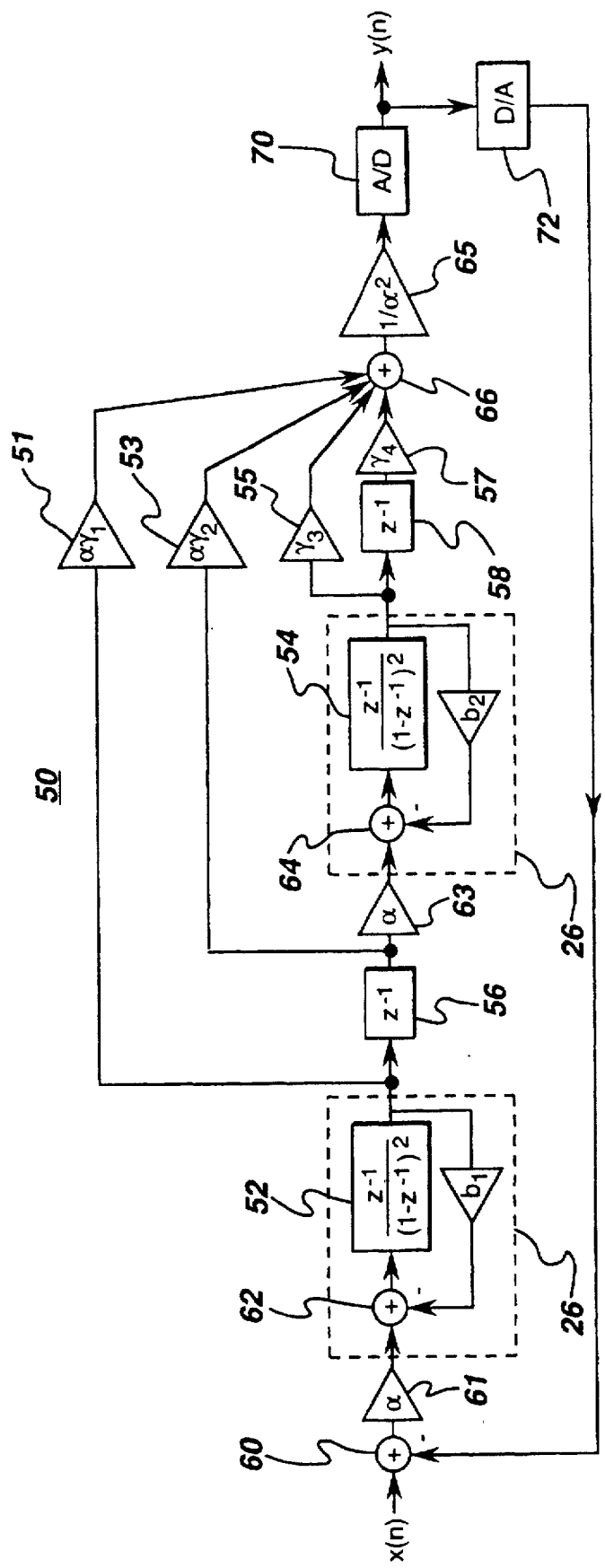
FIG. 4 is a block diagram of a linear equivalent circuit for a fourth-order FF-BP delta-sigma modulator in accordance with another embodiment of the present invention.

FIG. 4 illustrates, in schematic form, the linear equivalent circuit for a fourth-order feed-forward bandpass delta sigma modulator 50 in accordance with another embodiment of the invention. The input signal x(n) is sampled by modulator 50 at a sampling rate of $F_M$. Modulator 50 includes two pairs of cascaded integrators represented at 52 and 54, a first unit delay element 56 coupled to the output of first integrator pair 52 and a second unit delay element 58 coupled to the output of second integrator pair 54. Modulator 50 also includes an analog-to-digital (A/D) converter 70 for producing output signal y(n) in digital form and a one-bit digital-to-analog (D/A) converter 72 controlled by the output signal y(n) of the A/D converter and producing an analog feedback signal.

A first differential summing junction 60 is coupled to a feedback loop carrying the modulator output signal. A second differential summing junction 62, coupled to the output of first differential summing junction 60 through an amplifier 61 of gain a, also is coupled to receive a feedback signal from first integrator pair 52. A third differential summing junction 64, coupled to the output of a first unit delay element 56 through an amplifier 63 of gain $\alpha$, also is coupled to receive a feedback signal from second integrator pair 54. Summing junction 62 and integrator pair 52 together constitute a block that is essentially identical to block 26 shown in FIG. 1. Similarly, summing junction 64 and integrator pair 54 are also essentially identical to block 26 of FIG. 1. A fourth differential summing junction 66, coupled to the output of a second unit delay element 58 through an amplifier 57 of gain $\gamma_4$, also is coupled to receive feed-forward signals from the output of first integrator pair 52 through amplifier 51 of gain $\alpha\gamma_1$, from a first unit delay element 56 through an amplifier 53 of gain $\alpha\gamma_2$, and from a second integrator pair 54 through an amplifier 55 of gain $\gamma_3$. The quantization noise is represented as an additive noise source e(n) introduced by A/D converter 70 which is coupled to the output of fourth differential summing junction 66 through an amplifier 65 of gain $1/\alpha^2$. The output signal y(n) of modulator 50 is typically coupled to a digital filter (not shown), the output of which is, in turn, coupled to a decimator (not shown).

The overall transfer function (linear equivalent circuit) for modulator 50 is:

$$Y(z) = \frac{S_{Nr}(z)}{S_{Dr}(z)}\,X(z) + \frac{N_{Nr}(z)}{N_{Dr}(z)}\,E(z)(\text{“+”}) \quad (6)$$

where:

$$N_{Nr}(z)=[1-2\cos\omega_1\,z^{-1}+z^{-2}][1-2\cos\omega_2\,z^{-1}+z^{-2}](\text{“+”}) \quad (7)$$

$$\begin{aligned}N_{Dr}(z) &= 1+(-2\cos\omega_1-2\cos\omega_2+\gamma_1)z^{-1}, \\ &\quad (2+4\cos\omega_1\cos\omega_2-2\gamma_1\cos\omega_2+\gamma_2)z^{-2}, \\ &\quad (-2\cos\omega_1-2\cos\omega_2+\gamma_1-2\gamma_2\cos\omega_2+\gamma_3)z^{-3}+ \\ &\quad (1+\gamma_2+\gamma_4)z^{-4},\end{aligned} \quad (8)$$

$$S_{Nr}=\gamma_1 z^{-1}+(-2\gamma_1\cos\omega_2+\gamma_2)z^{-2}+(\gamma_1-2\gamma_2\cos\omega_2+\gamma_3)z^{-3}+ (\gamma_2+\gamma_4)z^{-4} \quad (9)$$

$$S_{Dr}(z)=N_{Dr}(z) \quad (10)$$

where $\omega_1=(\omega_0+\epsilon),\omega_2=(\omega_0-\epsilon)$, i.e., $\omega_1$ and $\omega_2$ are equispaced from the center frequency $\omega_0$.

The desired noise transfer function is:

$$NTF_{desired} = \frac{N_d(z)}{D_d(z)} = \frac{n_0+n_1 z^{-1}+n_2 z^{-2}+n_3 z^{-3}+n_4 z^{-4}}{1+d_1 z^{-1}+d_2 z^{-2}+d_3 z^{-3}+d_4 z^{-4}} \quad (11)$$

where:

$$d_1=-2\cos\omega_1-2\cos\omega_2=\gamma_1 \quad (12)$$

$$d_2=2+4\cos\omega_1\cos\omega_2-2\gamma_1\cos\omega_2+\gamma_2$$

$$d_3=-2\cos\omega_1-2\cos\omega_2-2\gamma_2\cos\omega_2+\gamma_3+\gamma_1$$

$$d_4=1+\gamma_2+\gamma_4.$$

Given the location of the notch frequencies $\omega_1$, $\omega_2$, and the $NTF_{desired}$, the circuit parameters are:

$$b_1=2(1-\cos\omega_1),\ b_2=2(1-\cos\omega_2), \quad (13)$$

$$\gamma_1=d_1+2\cos\omega_1+2\cos\omega_2$$

$$\gamma_2=d_2-2-4\cos\omega_1\cos\omega_2+2\gamma_1\cos\omega_2$$

$$\gamma_3=d_3=2\cos\omega_1+2\cos\omega_2-\gamma_1+2\gamma_2\cos\omega_2$$

$\gamma_4 = d_4 - \gamma_2^{-1}$

The above equations are evaluated sequentially.

The expressions for the NTF (N(z)), and STF (S(z)) are given by Equation 2 for second-order modulator 10 of FIG. 1 and by Equations 6–9 for the fourth-order modulator 50 of FIG. 4. With respect to both second-order modulator 10 and fourth-order modulator 50, and from the following relation:

$$S(z) = 1 - N(z), \qquad (14)$$

in the frequency region of interest, where the NTF is forced to have a null, the STF has approximately unity gain. Such unity gain for STF is inherent and is not forced externally.

Modulators 10 and 50 described above overcome the shortcomings of known modulators with respect to the limitations in range of input amplitudes and location of center frequency. More specifically, modulators 10 and 50 can accept input amplitudes up to −1 dB of full-scale and any center frequency ($F_S$) in the range [$F_S/90$, $90F_S/44$]. In addition, modulators 10 and 50 are not prone to internal overflow. An additional advantage is that modulators 10 and 50 require fewer circuit parameters and yield a STF with the inherent property that the magnitude responses are close to unity gain in the frequency region of interest.

While only certain preferred features of the invention have been illustrated and described, many modifications and changes will occur to those skilled in the art. For example, although second and fourth order modulators have been described herein, the present modulator architecture can be extended to higher order modulators. It is, therefore, to be understood that the appended claims are intended to cover all such modifications and changes as fall within the true spirit of the invention.

What is claimed is:

1. A second-order feed-forward bandpass delta sigma modulator comprising:

a pair of cascaded integrators including an integrator of transfer function $$\frac{1}{1-z^{-1}}$$

driving an integrator of transfer function $$\frac{z^{-1}}{1-z^{-1}};$$

a unit delay element coupled to an output of said cascaded integrators;

an analog-to-digital converter;

a digital-to-analog converter controlled by output signals from said analog-to-digital converter;

a first differential summing junction coupled to an output of said digital-to-analog converter and responsive to a modulator input signal;

a second differential summing junction coupled to an output of said first differential summing junction and coupled to receive a feedback signal from said cascaded integrators; and a third differential summing junction coupled between said analog-to-digital converter and said output of said unit delay element and also coupled to the output of said cascaded integrators.

2. The second-order feed-forward bandpass delta sigma modulator of claim 1 wherein the output of said cascaded integrators coupled to said third differential summing junction comprises a feed-forward connection.

3. A fourth-order feed-forward bandpass delta sigma modulator comprising:

first and second pairs of cascaded integrators;

a first unit delay element coupled to an output of said first integrator pair;

a second unit delay element coupled to an output of said second integrator pair;

an analog-to-digital converter;

a digital-to-analog converter controlled by output signals from said analog-to-digital converter;

a first differential summing junction responsive to an input signal and coupled to an output of said digital-to-analog converter;

a second differential summing junction coupled to an output of said first differential summing junction and coupled to receive a feedback signal from said first integrator pair;

a third differential summing junction coupled between an output of said first unit delay element and an input to said second integrator pair and coupled to receive a feedback signal from said second integrator pair; and a fourth differential summing junction coupled to an output of said second unit delay element and also coupled to the outputs of each of said first integrator pair, said first unit delay element, and said second integrator pair.

4. The fourth-order feed-forward bandpass delta sigma modulator of claim 3 wherein the output of each of said integrator pairs and said first unit delay element coupled to said fourth differential summing junction comprises feed-forward connections.

* * * * *